SEMICONDUCTOR SWITCHING CIRCUIT

Filed Aug. 20, 1968

INVENTOR
CARL E. ATKINS
BY Eyre Mann & Lucas
ATTORNEYS

United States Patent Office 3,508,120

Patented Apr. 21, 1970

3,508,120
SEMICONDUCTOR SWITCHING CIRCUIT

Carl E. Atkins, Montclair, N.J., assignor to Wagner Electric Corporation, a corporation of Delaware Continuation-in-part of application Ser. No. 550,765, May 17, 1966. This application Aug. 20, 1968, Ser. No. 755,507

Int. Cl. H03k *17/30*

U.S. Cl. 317—148.5 8 Claims

ABSTRACT OF THE DISCLOSURE

A pair of complementary transistors are connected in the regenerative feedback configuration to form a solid-state switching circuit. A resistor and a capacitor are series-connected between the base and emitter of one transistor to provide bias voltage to the switching circuit and to introduce positive hysteresis into the circuit.

The present application is a continuation-in-part of co-pending application Ser. No. 550,765 filed on May 17, 1966 by Carl E. Atkins, now abandoned.

The present invention relates to a semiconductor switching circuit which includes self-biasing circuitry. More specifically, a switching circuit is formed by connecting two complementary transistors in the regenerative feedback configuration, and by providing an RC circuit for supplying the combined transistors with bias voltage. In order to illustrate the operation of the semiconductor switch described and claimed herein, a capacitance-responsive circuit is described. This capacitance-responsive circuit comprises a relaxation oscillator of the type described and claimed in U.S. Patent 3,199,033, issued Aug. 3, 1965, to Atkins and Ziolkowski.

The present invention provides an improved switching circuit which avoids one or more of the disadavntages and limitations of prior art switches. One advantage of the present invention is the reduction of the number of costly components in a semiconductor switching circuit which is to be operated by small electrical signals. A second advantage of the present invention is the provision of bias voltage for the semiconductor switch without the use of batteries or other auxiliary bias supply sources. A further advantage of the present invention is the provision of a variable positive hysteresis in the semiconductor switching circuit. Thus, any negative hysteresis which may result from the proximity of circuit elements and conductors in the physical embodiment of the circuit shown herein, for example, may be cancelled out, or the hysteresis level may be further increased so as to require a larger signal to deactivate the circuit than was required to activate same.

The circuit embodying the present invention includes a PNP transistor and an NPN transistor with the base of each transistor connected to the collector of the other transistor. The emitters of the two transistors are connected between alternating current supply source terminals generally in series with an impedance which is a current-limiting resistor in the circuit shown herein. However, this impedance may also be a relatively low-power load. The input terminals across which the electrical switching signal is applied are the base and emitter electrodes of the transistor which is connected to the low or neutral line. The bias storage circuit which provides the bias voltage includes a capacitor and a resistor connected in series across the base and emitter electrodes of the PNP transistor. The output circuit is connected to the two emitter electrodes.

For a better understanding of the present invention, reference should be made to the description taken in connection with the accompanying drawings, of which:

Figure 1:
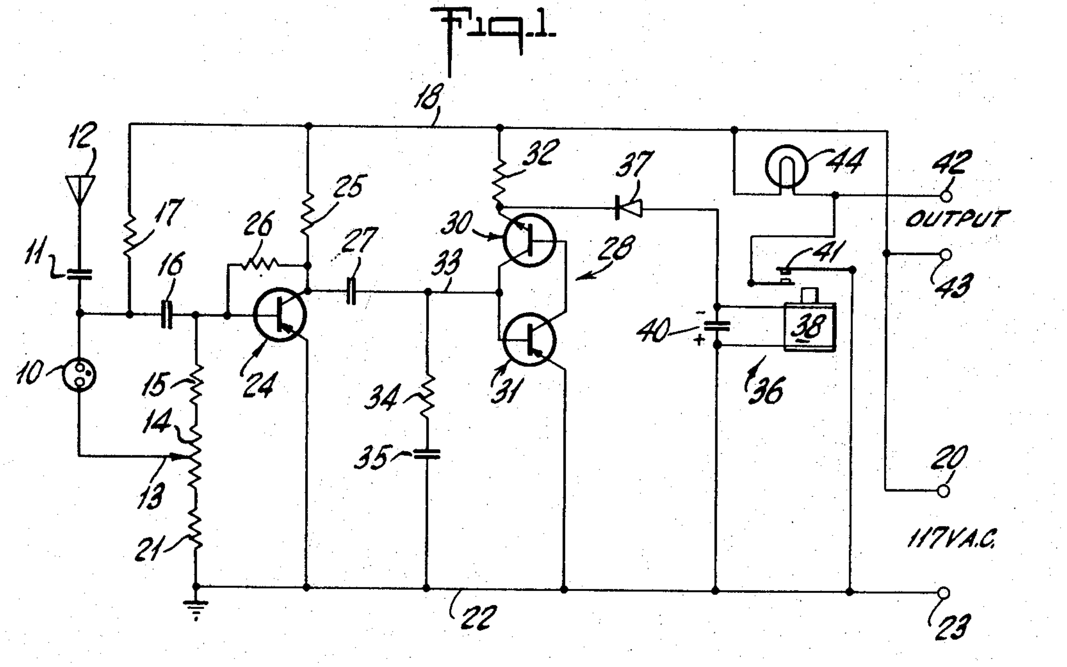
FIG. 1 is a schematic wiring diagram of a circuit embodying the invention.

Referring now to FIG. 1, the circuit includes a low-frequency relaxation oscillator comprising a neon lamp 10 having two conductive electrodes in an envelope containing a gas at a reduced pressure. One of the lamp electrodes is connected to a capacitor 11 in series with antenna 12, which in this case may be an electrode placed in a convenient position where it may be manually operated as a signalling means. The other terminal of lamp 10 is connected to an adjustable contact which may be moved along a resistor 14. A portion of this resistor 14 is connected in series with another resistor 15 and a second capacitor 16, these components being bridged across the lamp electrodes.

The junction of capacitor 16 and lamp 10 is connected through a series resistor 17 to a conductor 18 and one terminal 20 of a source of alternating current power. The other electrode of lamp 10 is connected through a portion of adjustable resistor 14 and series resistor 21 to a grounded conductor 22 and the other power terminal 23. Conductor 18 is also connected to the collector of a transistor 24 in series with a resistor 25. The emitter of this transistor is connected directly to the ground conductor 22 and the base of transistor 24 is connected to the junction of resistor 15 and capacitor 16. A suitable high resistor 26 is connected between the transistor base and collector to provide the proper voltage bias. Transistor 24 serves as an amplifier of the output of the oscillator described above. The output of this amplifier is fed through a capacitor 27 to a semiconductor switching circuit 28.

Switching circuit 28 includes two transistors 30 and 31 with the base electrode of each transistor connected to the collector electrode of the other transistor. Transistor 30 is an NPN type with its emitter connected through a resistor 32 to conductor 18. Transistor 31 is a PNP type with its emitter connected to conductor 22. The base of transistor 31 is connected to the switch input conductor 33 and capacitor 27. Conductor 33 is also connected to a bias storage circuit which includes a resistor 34 and a capacitor 35.

The switching circuit 28 is bridged by a relay 36, this circuit including a diode 37, a relay winding 38, and a large capacitor 40. This circuit is bridged across the two emitters of transistors 30 and 31. Relay 36 includes a pair of normally open contacts 41 connected between power terminal 23 and an output terminal 42. The other output terminal 43 is connected to power terminal 20. An indicating lamp 44 or some other type of load may be connected across the output terminals, 42, 43.

The operation of this circuit is as follows:

When AC voltage is applied to the neon lamp 10 through resistors 17, 14 and 21, the lamp is alternately conductive and non-conductive because of the shunt circuit, the first of which comprises capacitor 11 and antenna 12, and the second of which comprises capacitor 16 and resistors 15, 14 and 21. These components form a relaxation oscillator and the values of the capacitor and resistors are such that the frequency of oscillation is within the range of 2,000 to 4,000 hertz. Capacitors 11 and 16 charge simultaneously (with the lamp non-conducting) to the firing potential of the lamp. Then, when the lamp fires and become conductive, capacitors 11 and 16 discharge through the lamp until the current through the lamp is no longer sufficient to maintain it conductive, at which time the lamp becomes non-conductive and the cycle starts again. This type of oscillator works equally well with a positive or negative voltage applied to its terminals, and therefore can operate normally on both halves of the alternating wave. By the proper selection of oscillator component values and by proper adjustment of contact 13, these two voltages may be arranged to balance each other or either one may be made greater than the other.

When AC power is applied to the present circuit, the two output voltages are unbalanced and amplified voltage pulses are transmitted by amplifier 24 to the switching circuit 28, thereby rendering both the transistors 30 and 31 normally conductive by overcoming the bias voltage provided by capacitor 35. Thus, the relay winding 38 is shunted so that the relay contacts 41 remain open and no power is transmitted to output terminals 42, 43. Switching circuit 28, including transistors 30 and 31, is similar to switching circuits shown and described in U.S. Patents 3,199,033, 3,200,304 and 3,200,305, issued to the assignee of this application. When a voltage is applied to the base of transistor 31, causing it to conduct, a current flows from the emitter to the collector of transistor 31, then to the base of transistor 30, making it conductive also. This action applies a negative voltage to the collector of transistor 31, thereby maintaining it in a conductive condition for the duration of a half cycle of the 60-cycle wave. When the negative current pulses flow through the two transistors, relay 36 is normalized by the shunting action of the transistor combination and contacts 41 are retained in their opened condition.

During the positive half cycles of the 60-cycle voltage wave, current is prevented from flowing to the relay winding 38 by diode 37 and the relay contacts are retained in their opened condition. Zener breakdown of the emitter-collector junction of transistor 30 occurs during the positive half-cycles, thereby permitting the flow of charging current pulses which impress a bias voltage across capacitor 35.

Now let it be assumed that a portion of the human body, such as a hand, is moved to make contact with antenna 12. This action increases the capacity of the antenna system and conditions the oscillator to change its output voltage distribution so that the two portions of the voltage wave counteract each other and substantially reduced output pulses are transmitted by the amplifier stage 24 to the switching circuit 28. Under these conditions, the voltage across capacitor 35 biases the transistors 30 and 31 non-conductive, and current flows through the relay winding circuit which includes diode 37 and relay winding 38, thereby closing contacts 41 and applying power to the output terminals 42 and 43. Because of the placement of diode 37 in the relay winding circuit, only negative pulses actuate the relay. Capacitor 40 is operative to maintain the requisite level of DC energizing current through the relay winding 38, thus maintaining the relay in its actuated condition during the positive half-cycles of applied AC power. Contacts 41 remain closed only as long as the antenna 12 detects the minimum signal level, i.e., the minimum increase in capacitance to ground.

During normal circuit conditions, i.e., when no minimum signal level is detected by antenna 12, the transistors 30 and 31 (and therefore switching circuit 28) are conductive during the negative half-cycles of applied AC power, thus periodically affording capacitor 35 a low-impedance discharge path through the base-emitter junction of transistor 31. However, during the period in which the transistors 30 and 31 (and therefore switching circuit 28) are non-conductive during both the positive and negative half-cycles of applied AC power, the base-emitter junction of transistor 31 no longer presents a low-impedance discharge path for transistor 35. Thus, the voltage across capacitor 35 will rise to a higher value than during normal circuit conditions. This higher voltage is limited, however, by the Zener breakdown voltage level of the base-emitter junction of transistor 31. A larger negative output pulse from amplifying transistor 24 will be required in order to overcome the increased bias voltage across capacitor 35 and thus render switching circuit 28 conductive again. The magnitude of the negative pulse required to overcome the bias voltage provided by the capacitor 35 is directly proportional to the capacitance of capacitor 35. The requirement of a larger negative pulse requires, in turn, a larger change in the capacitance to ground detected by the antenna 12. Hence, a positive hysteresis is introduced into the circuit, since the positive increment of capacitance which must be sensed by antenna 12 in order to energize relay 38 is smaller than the negative increment of capacitance which subsequently must be sensed by the antenna in order to de-energize the relay.

Although the foregoing discussion of the positive hysteresis feature encompasses the entire circuit shown schematically in FIG. 1, it should be noted that this feature resides in the subcombination of the combined switching and bias storage circuits, respectively, comprising transistors 30 and 31 and the resistor 34 and capacitor 35 connected in series between the base and emitter of transistor 31. When the emitters of transistors 30 and 31 are connected in a current path, the positive hysteresis feature of the aforementioned subcombination is inherent, regardless of the triggering signal source or the load to be controlled.

Figure 2:
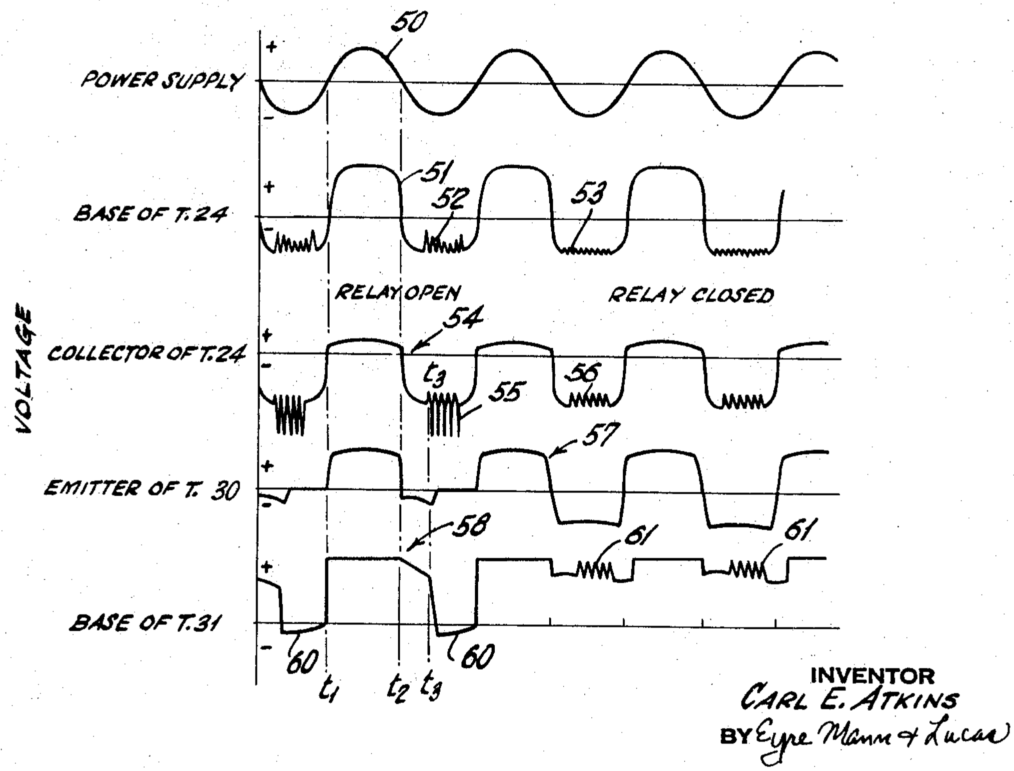
FIG. 2 is a graph showing some of the wave forms existing in the circuit during its operation.

Referring now to FIG. 2, the top graph illustrates the power supply wave 50 applied to terminals 20 and 23. The second graph shows the wave form 51 existing at the base of transistor 24 as referred to the ground terminal 23. This wave form shows that, under normal conditions, there are no higher frequency oscillations transmitted during the positive half-cycle and that the top of the positive half-wave is partially cut off. This is due to the fact that the collector electrode of transistor 24 passes a substantial current when it is positive with respect to the base and this flow of current reduces the voltage of the positive half-cycles of the 60-cycle wave. Also, during the positive half-cycles of the 60-cycle wave, the high frequency pulses are negative-going and they are absorbed by the low impedance path through the base-emitter junction of transistor 24 to ground. During the negative half-cycles, the oscillator generates a predominantly positive sawtooth wave 52 which is applied to the base electrode of transistor 24. The negative parts of this wave are shunted to ground through the base-emitter junction of transistor 24.

When the antenna 12 is touched by a conductive object, such as a finger, and its capacitance changed, the oscillations 53 are reduced in size because of the higher net capacitance in the antenna loop of the oscillator. The resulting reduced signal at the base of transistor 31 renders non-conductive the switching circuit 28 comprising transistors 30 and 31. Thus, the relay energization circuit is no longer shunted, the relay is actuated, and contacts 41 are closed, applying line voltage to the output terminals 42 and 43. The change in capacitance shifts the oscillator waves from positive going pulses to negative pulses and these pulses are reduced in amplitude so that they do not override the bias of the base of transistor 31.

The third graph 54 shows the voltage between the collector electrode of transistor 24 and ground. The higher frequency sawtooth wave 55 is amplified and the polarity of the pulses is reversed. When the antenna capacitance is changed, the negative sawtooth pulses are almost eliminated but the positive pulses 56 are retained. These pulses 56 are derived from the voltage measured across the lower part of resistor 14 and resistor 21.

The fourth graph 57 is the voltage across the emitter of transistor 30 and ground. This shows that the switch combination 30, 31 is not activated during the positive half-cycles of the power supply wave. During the negative half-cycles, when there is no added capacitance, the higher frequency oscillations make the switch 30, 31 conductive, as explained above, and the voltage between the emitter of 30 and ground is reduced to almost zero. When the capacitance of antenna 12 is altered, and the negative pulses are eliminated, the switch 30, 31 remains open and the negative half-cycles are similar to the positive half-cycles.

The fifth graph 58 is the voltage across the base of transistor 31 and ground. In general, the positive half-cycle from $t_1$ until time $t_2$, is similar to the positive half-cycle of the wave 57. At time $t_2$, the negative half-cycle begins and the bias potential of the base of transistor 31 starts to drop slowly because of the discharge of capacitor 35. At time $t_3$, the oscillator is fired (starts to oscillate, see curve 54) and the potential of the base then drops to a negative value as indicated by curve portion 60. When the capacitance of antenna 12 is altered and the switch 30, 31 opened, there is no change in the positive half-cycles but during the negative half-cycles, transistor 31 is cut off and the potential of the base 31 (and the collector of 30) is raised to a positive value and the higher frequency pulses 61 appear in the wave since they are not shunted to ground.

It should be noted that diode 37 serves to retain the charge on capacitor 40 when the switching transistors 30, 31 are subjected to transient pulses which may cause the switch combination 30, 31 to become conductive for a short time interval at a time when the antenna capacity is not changed. Also, it should be noted that the switching transistors 30, 31 can be reversed, together with a reversal of diode 37.

The advantages of the present invention will be apparent to those skilled in the art, as well as changes which could be made in the foregoing embodiments without departing from the spirit and scope of the invention. Therefore, it should be understood that the present invention is not to be limited to the foregoing description of the specific embodiments thereof, but is to be determined by the spirit and scope of the accompanying claims.

What I claim is:

1. A semiconductor switching circuit comprising:

(1) first and second transistors of first and second conductivity types, respectively, the base of each transistor being connected to the collector of the other transistor; and (2) bias storage circuit means connected between the base and the emitter of said first transistor and operative, when the emitters of said transistors are connected in an alternating current path, to be charged by current flowing across a junction of said second transistor and to bias the combined first and second transistors non-conductive.

2. A semiconductor switching circuit according to claim 1 wherein said bias storage circuit means comprises a resistance and a capacitance connected in series.

3. A semiconductor switching circuit according to claim 1 wherein said first transistor is a PNP transistor and said second transistor is a NPN transistor.

4. A semiconductor switching circuit according to claim 1 wherein said first transistor is a NPN transistor and said second transistor is a PNP transistor.

5. A semiconductor switching circuit according to claim 1 wherein when a signal of sufficient magnitude and proper polarity is applied to the base of said first transistor so as to render the combined first and second transistors conductive during alternate half-cycles of applied alternating current power, the magnitude of the increment by which said signal must be reduced in order to render said combined first and second transistors non-conductive during said alternate half-cycles is smaller than the increment by which said reduced signal must subsequently be increased in order to render said combined first and second transistors conductive during said alternate half-cycles.

6. A semiconductor switching circuit according to claim 1 further comprising:

(1) electromagnetic relay means for controlling energization of a load and including a winding having one terminal connected to the emitter of said first transistor, an armature, and at least one contact; and (2) rectifying means interconnecting the other terminal of said winding to the emitter of said second transistor and operative to permit current flow during the same portion of the applied alternating current power cycle during which the combined first and second transistors permit current flow when conductive.

7. A semiconductor switching circuit according to claim 6 further comprising a filtering capacitance connected between said terminals and said winding.

8. A semiconductor switching circuit according to claim 1 further comprising a direct-current-blocking capacitance connected to the base of said first transistor for application of a signal thereto.

References Cited

UNITED STATES PATENTS

| | | | |
|---|---|---|---|
| 3,200,304 | 8/1965 | Atkins et al. | 317—148.5 X |
| 3,255,380 | 6/1966 | Atkins et al. | 328—5 X |
| 3,382,408 | 5/1968 | Atkins | 328—5 X |

LEE T. HIX, Primary Examiner

U.S. Cl. X.R.

307—255, 296, 313; 315—362; 328—5